United States Patent
Lur et al.

[11] Patent Number: 5,924,006
[45] Date of Patent: Jul. 13, 1999

[54] TRENCH SURROUNDED METAL PATTERN

[75] Inventors: Water Lur, Taipei; Chen-Chiu Hsue; Hong J. Wu, both of Hsin-Chu, all of Taiwan

[73] Assignee: United Microelectronics Corp., Taiwan

[21] Appl. No.: 08/807,862

[22] Filed: Feb. 26, 1997

Related U.S. Application Data

[63] Continuation of application No. 08/345,128, Nov. 28, 1994, abandoned.

[51] Int. Cl.$^6$ .................................................. H01L 21/469
[52] U.S. Cl. ........................... 438/626; 438/633; 438/646; 438/926; 438/669; 438/619
[58] Field of Search .................... 438/626, 631, 438/633, 646, 926, 669, 619

[56] References Cited

U.S. PATENT DOCUMENTS

| | | | |
|---|---|---|---|
| 5,004,704 | 4/1991 | Maeda et al. | 437/195 |
| 5,032,890 | 7/1991 | Ushiku et al. | |
| 5,124,275 | 6/1992 | Selle et al. | 437/80 |
| 5,166,101 | 11/1992 | Lee et al. | 437/238 |
| 5,182,235 | 1/1993 | Eguchi | 437/238 |
| 5,192,715 | 3/1993 | Sliwa, Jr. et al. | 437/195 |
| 5,278,103 | 1/1994 | Mallon et al. | 437/240 |
| 5,278,105 | 1/1994 | Eden et al. | |
| 5,281,555 | 1/1994 | Cho | 437/195 |
| 5,310,700 | 5/1994 | Liene et al. | 437/195 |
| 5,357,140 | 10/1994 | Kozasa | 257/752 |
| 5,407,860 | 4/1995 | Stoltz et al. | 437/180 |
| 5,441,915 | 8/1995 | Lee | 437/195 |
| 5,476,817 | 12/1995 | Numata | 437/195 |
| 5,494,853 | 2/1996 | Lur | 437/195 |
| 5,516,720 | 5/1996 | Lur at al. | 437/67 |

FOREIGN PATENT DOCUMENTS

| | | |
|---|---|---|
| 62-265741 | 11/1987 | Japan . |
| 0316223 | 1/1991 | Japan . |

OTHER PUBLICATIONS

Stanley Wolf, Ph.D., "Silicon Processing for the VLSI Era," vol. 2: Process Integration, (1990), pp. 200–204.

*Primary Examiner*—Caridad Everhart
*Attorney, Agent, or Firm*—Rabin & Champagne, P.C.

[57] ABSTRACT

A new method of forming the dielectric layer of an integrated circuit using metal layout is described. An insulating layer is formed over semiconductor device structures in and on a semiconductor substrate. Metal lines are formed overlying the insulating layer wherein the metal line mask is modified so that narrow trenches with constant width and depth are etched surrounding the metal lines and the remaining metal areas are not etched away but are left as dummy metal areas. A dielectric layer is deposited over the metal lines and dummy metal areas wherein voids are formed within the trenches between metal lines and wherein the top surface of the dielectric layer is planarized. The voids act to release system stress and to lower capacitance between the metal lines.

22 Claims, 4 Drawing Sheets

TRENCH SURROUNDED METAL PATTERN

This a continuation of application Ser. No. 08/345,128 filed on Nov. 28, 1994, now abandoned.

RELATED PATENT APPLICATION

Co-pending U.S. patent application Ser. No. 08/280221 filed on Jul. 25, 1994 to "To Solve Holes in Passivation by Metal Layout" by Water Lur now U.S. Pat. No. 5,494,853.

BACKGROUND OF THE INVENTION (1) Field of the Invention

The invention relates to a method of improving step coverage of a dielectric layer over metal lines, and more particularly, to a method of improving step coverage of a dielectric layer over metal lines by surrounding the metal lines with trenches and dummy metal areas in the fabrication of integrated circuits.

(2) Description of the Prior Art

Conventional metal layout is function dominated and metal lines are located at random. Metal line spacings vary considerably. Therefore, step coverage of subsequent intermetal dielectric or passivation layers is inevitably unacceptable. The resulting bad planarization causes reliability problems. Referring to FIG. 1, there is shown a top plan view of metal lines of the prior art. Metal lines 20 and 22 have been formed overlying insulating layer 16. View 2—2 of FIG. 1 is shown in FIG. 2 as a cross-section. When dielectric or passivation layer 28 is deposited over the metal lines 20 and 22, the layer is not planarized especially between widely spaced metal lines 20 and 22. This results in bad step coverage of the overlayers. The step coverage of the passivation layer on high aspect ratio metal lines is very poor— less than 40%. In addition, the large step height will challenge the depth of focus of photolithography and thus narrow the process window. Moreover, etching residue for the overlayer is easily formed at the bottom corner 34, causing a stringer problem.

Keyhole type tunnels 30 are formed between metal lines with spacing smaller than about 1 micrometer. These tunnels open up at metal line terminals, at points where the underlying metal layer is absent, and at turns in metal lines. During resist coating, the resist sinks into the underlying tunnels, making the resist layer thinner in these areas. The thinner resist generates holes in the passivation layer after pad etch which then degrades reliability. The sunken resist also causes a resist residue problem.

U.S. Pat. No. 5,032,890 to Ushiku et al describes the formation of dummy lines for improved next level coverage of an interconnection layer.

SUMMARY OF THE INVENTION

A principal object of the present invention is to provide an effective and very manufacturable method of forming the dielectric layer of an integrated circuit.

Another object of the present invention is to provide a method of forming the dielectric layer of an integrated circuit with improved step coverage over metal lines.

A further object of the invention is to provide for stress relaxation of the integrated circuit.

Yet another object is to provide capacitance reduction of the integrated circuit.

In accordance with the objects of this invention a new method of forming the dielectric layer of an integrated circuit using metal layout is achieved. An insulating layer is formed over semiconductor device structures in and on a semiconductor substrate. Metal lines are formed overlying the insulating layer wherein the metal line mask is modified so that narrow trenches with constant width and depth are etched surrounding the metal lines and the remaining metal areas are not etched away but are left as dummy metal areas. A dielectric layer is deposited over the metal lines and dummy metal areas wherein voids are formed within the trenches between metal lines and wherein the top surface of the dielectric layer is planarized. The voids act to release system stress and to lower capacitance between the metal lines.

BRIEF DESCRIPTION OF THE DRAWINGS

In the accompanying drawings forming a material part of this description, there is shown.

DETAILED DESCRIPTION OF THE PREFERRED EMBODIMENTS

In the present invention, the metal line pattern is defined by surrounded trench etching. Dummy metal areas are located between functional metal lines. The trenches surrounding the metal lines have about the same width and depth. It is very easy to form a planarized dielectric over such a metal layer. The original metal line mask is modified to allow for narrow etched trenches surrounding the functional metal lines leaving non-functional metal everywhere else.

Figure 1:
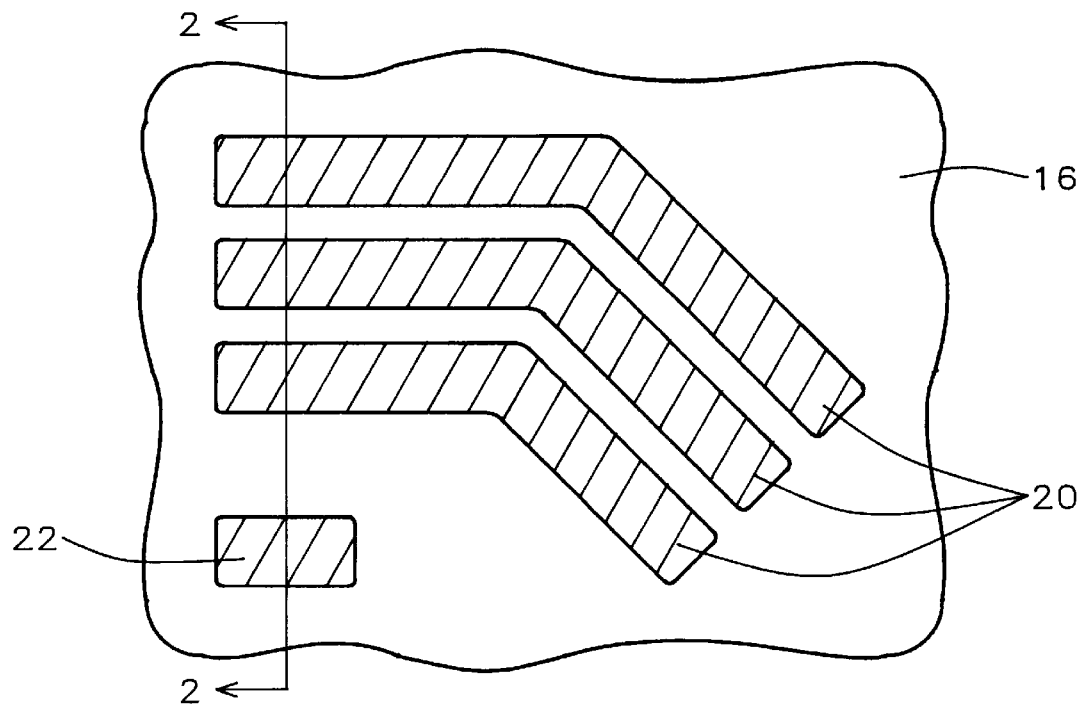
FIG. 1 schematically illustrates a top view of metal lines of the prior art.
Figure 2:
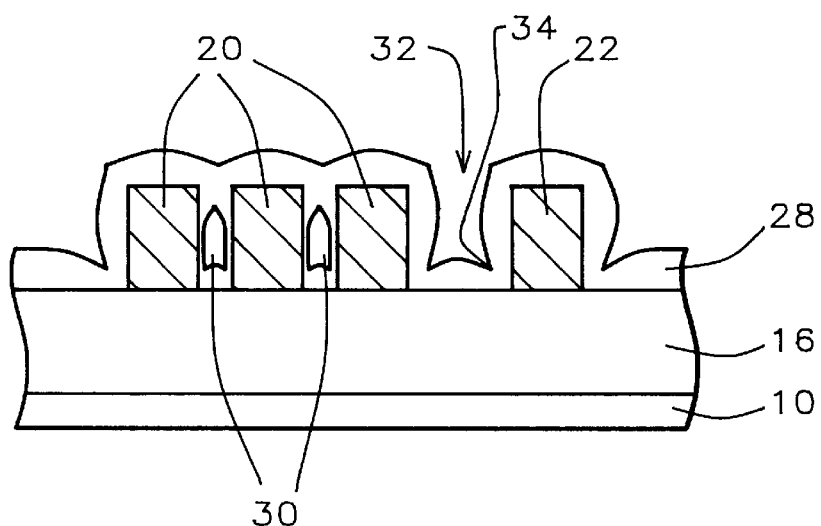
FIG. 2 schematically illustrates in cross-sectional representation metal lines of the prior art.
Figure 3:
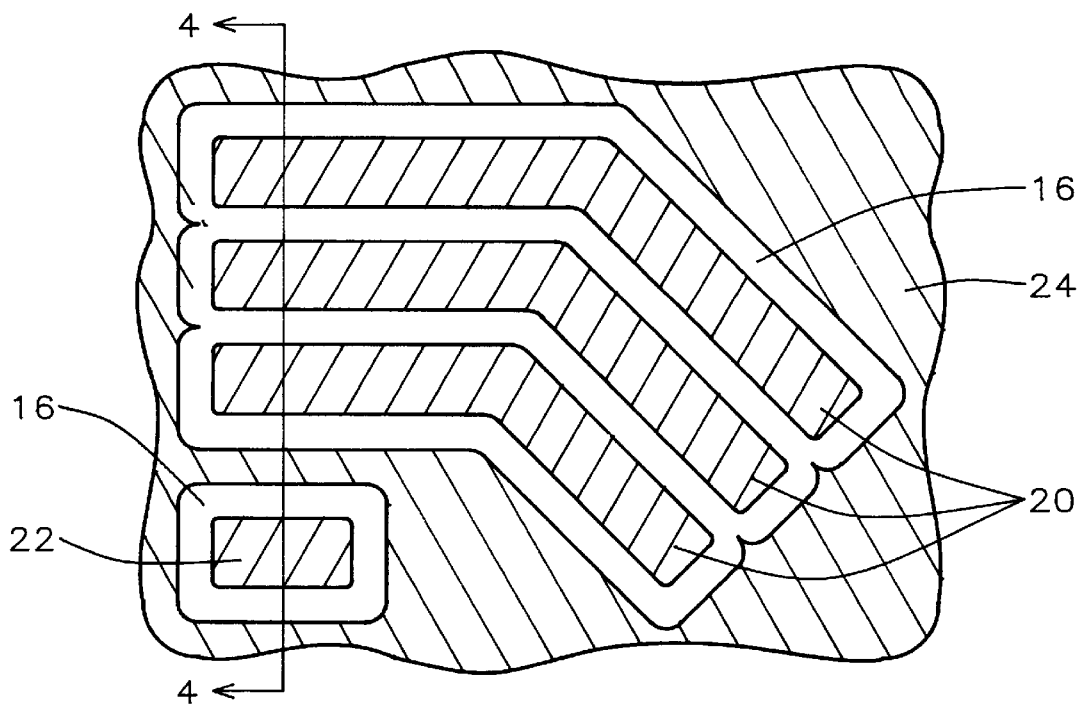
FIG. 3 schematically illustrate a top view of metal lines of the present invention.

Referring now to FIG. 3, a top plan view of metal lines is shown. Metal lines 20 and 22 are formed over insulating layer 16. The metal lines are defined by the trenches surrounding them. All remaining metal 24 is left as dummy metal areas which are non-functional, but which allow for overall planarization.

Figure 4:
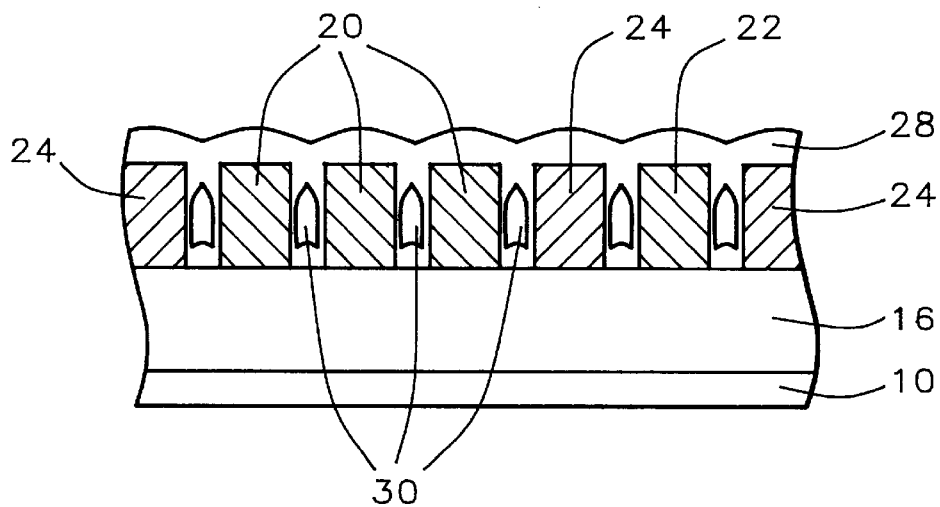
FIG. 4 schematically illustrates in cross-sectional representation metal lines of the present invention.

FIG. 4 illustrates view 4—4 of FIG. 3. Semiconductor substrate 10 may be a monocrystalline silicon substrate or may contain semiconductor device structures and lower level metallization on a monocrystalline silicon substrate. Insulating layer 16 covers the surface of the semiconductor substrate. Dielectric or passivation layer 28 is planarized. No wide spaces exist between metal lines to cause poor step coverage. Trenches of approximately constant width and depth lie between each metal area, functional and non-functional. The keyhole tunnels 30 do not open up because there are no large areas where the metal layer is absent. The turns in the metal lines have the same width trenches as the straight parts of the lines so the tunnels will not tend to open there as they do in the prior art.

The typical trench width is less than about 0.8 microns. This will allow for the formation of the keyhole tunnels, or voids. These voids between the metal lines are used to reduce system stress and to lower the parasitic capacitance between the metal lines, especially in the sub half-micron area, to improve the speed of the circuits. Capacitance $C=\epsilon A/t$, where A is the conductor area which is the product of height by length for parallel metal lines, $\epsilon$ is the dielectric constant of the inter-metal dielectric material, and t is the thickness of dielectric material. The $\epsilon$'s of SiO2, Si3N4, and air are about 4.0, 7.5, and 1.0, respectively. Therefore, the presence of voids between metal lines can reduce parasitic capacitance.

Figure 5:
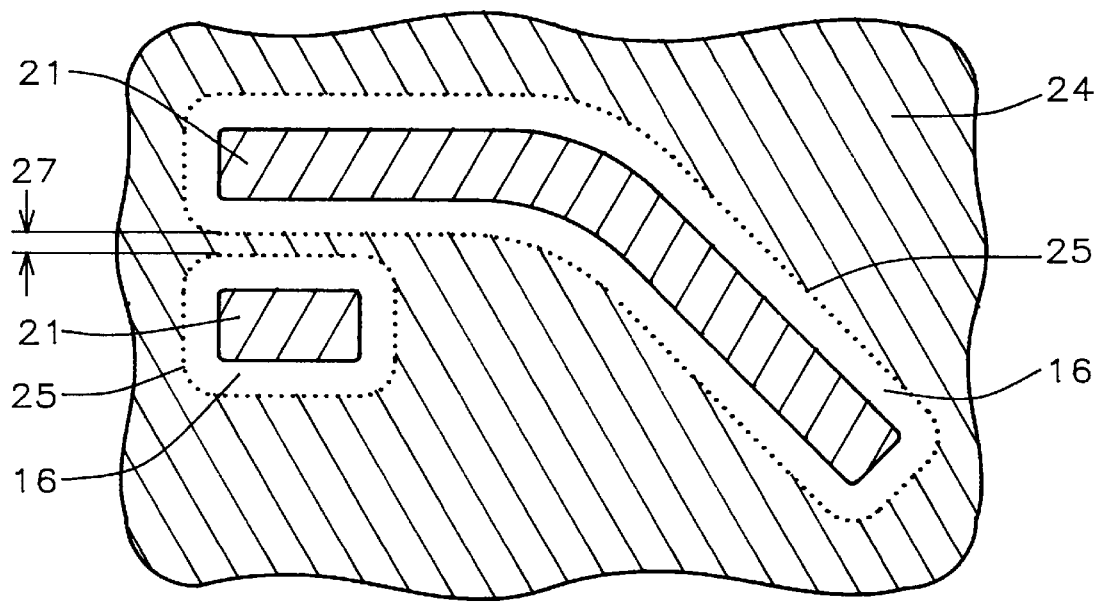
FIGS. 5 and 6 schematically illustrate a top view of metal lines of the present invention.
Figure 6:
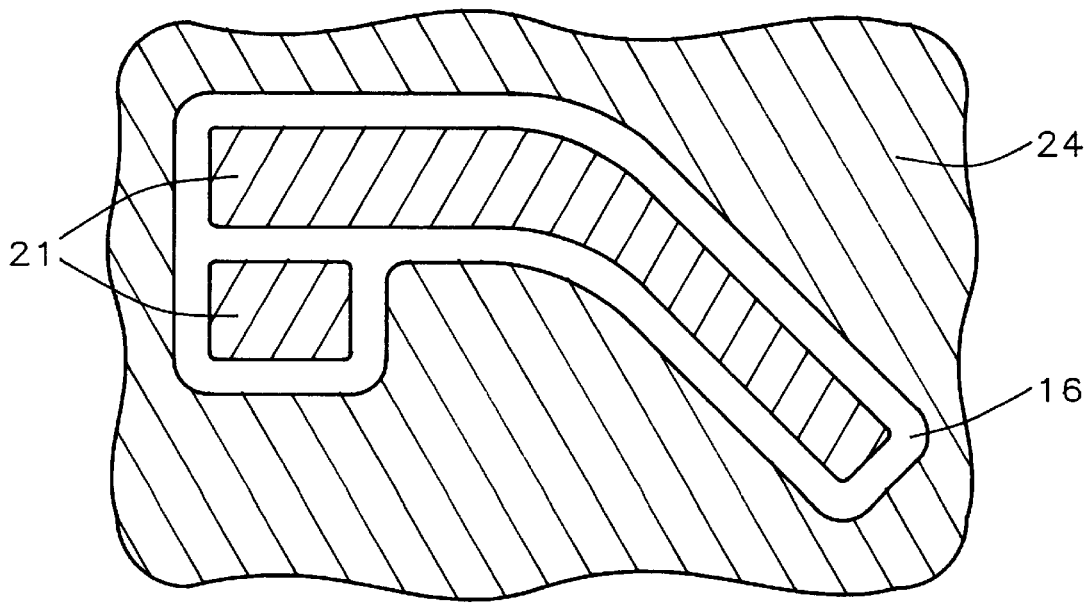

In calculating the width of the trenches, a minimum feature size is adopted for which the parasitic capacitance is acceptable. The minimum trench width should be the critical feature size that is limited by lithography resolution. The maximum trench width depends on the subsequently deposited dielectric thickness. Theoretically, the trench width should be smaller than twice the thickness of the subsequently deposited dielectric. Referring to FIG. 5, there are shown two metal lines 21. The dotted lines 25 show the trenches that would be formed using the desired trench width. If the spacing between the metal lines 27 is wider than three times the critical feature size, then the spacing 27 can be easily patterned. However, if the spacing 27 between the two trenches is too narrow due to the lithography resolution limitation, the solution is to widen the metal lines 21 as shown in FIG. 6. There will be only the width of the trench between the two lines and there will be no dummy metal area between the two lines.

Figure 7:
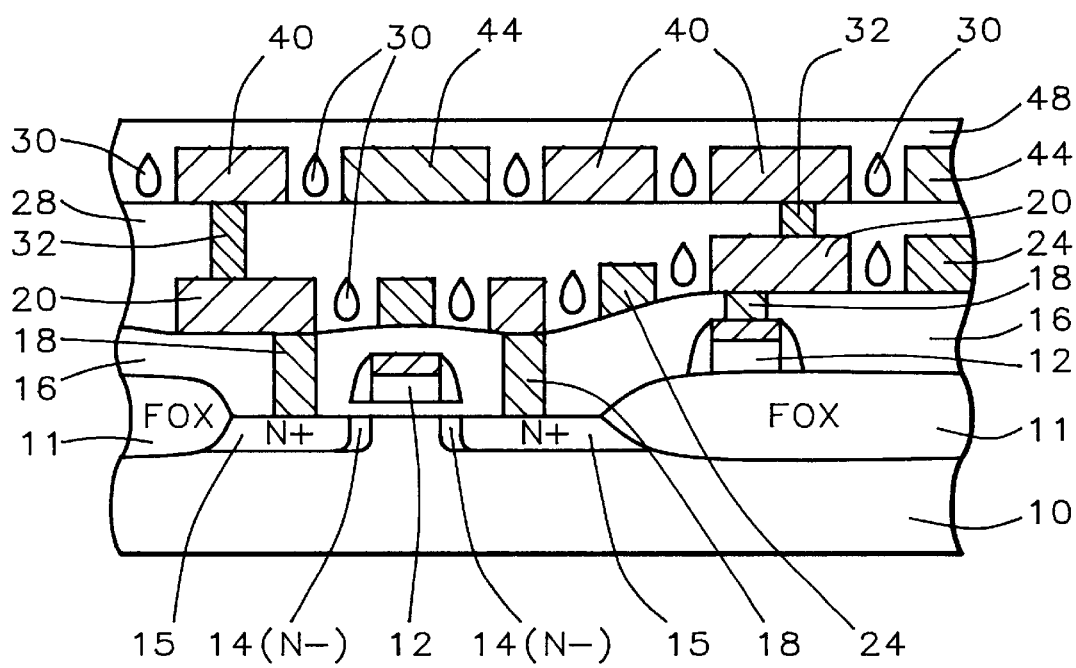
FIG. 7 schematically illustrates in cross-sectional representation a completed integrated circuit of the present invention.

Referring now to FIG. 7, there is illustrated a completed integrated circuit fabricated according to the process of the present invention. Semiconductor device structures including gate electrodes 12 and source and drain regions 15 have been formed in and on semiconductor substrate 10. Dielectric layer 16 covers the semiconductor device structures. Openings are made through the insulating layer 16 to the semiconductor substrate and to the semiconductor device structures to which contact is to be made, as shown. Tungsten plugs 18 fill the contact openings. A first metal layer is deposited over the insulating layer 16. The metal layer is patterned according to the invention in which trenches are etched surrounding the metal lines, leaving the remainder of the metal layer as dummy metal areas. Functional metal lines 20 and non-functional metal lines 24 are shown. The trenches between both functional and non-functional metal lines are of about the same width.

Intermetal dielectric layer 28 is deposited over the patterned first metal layer resulting in a planarized layer in which keyhole tunnels 30 are formed within the trenches between metal lines. Openings are made through the intermetal dielectric layer 28 to the first metal layer where contacts are to be made. The contact openings are filled with tungsten plugs 32.

A second metal layer is deposited over the intermetal dielectric layer 28 and patterned according to the process of the invention in which trenches are etched surrounding the metal lines, leaving the remainder of the metal layer as dummy metal areas. Functional metal lines 40 and non-functional metal lines 44 are shown. The trenches between both functional and non-functional metal lines are of about the same width.

Passivation layer 48 is deposited over the patterned second metal layer resulting in a planarized layer in which keyhole tunnels 30 are formed within the trenches between metal lines. This completes the integrated circuit.

The metal layout of the present invention allows overall planarization of a dielectric or passivation layer over patterned metal layer. It promotes the formation of keyhole tunnels between metal lines, but prevents the formation of openings to the tunnels. This prevents the generation of holes in the overlying passivation layer caused by resist thinning because the resist does not sink into the tunnels. The tunnels provide for stress relaxation in the system and lowered capacitance between metal lines to improve the speed of the circuits.

While the invention has been particularly shown and described with reference to the preferred embodiments thereof, it will be understood by those skilled in the art that various changes in form and details may be made without departing from the spirit and scope of the invention.

What is claimed is:

1. The method of planarizing an integrated circuit comprising:

forming semiconductor device structures in a semiconductor substrate;

depositing a conducting layer over said structures;

forming conducting lines and dummy conducting areas in said conducting layer, wherein all conducting lines and all dummy conducting areas in said conducting layer are formed by etching trenches surrounding said conducting lines, said trenches being formed to have a width approximately equal to a lithography resolution limit; and depositing a substantially planarized dielectric layer overlying said conducting lines and said dummy conducting areas.

2. The method of claim 1 wherein voids are formed within said trenches between said conducting lines and said dummy conducting areas.

3. The method of claim 1 wherein said trenches have approximately the same depth.

4. The method of claim 1 wherein said trenches are smaller than twice the thickness of said planarized dielectric layer.

5. The method of claim 1 wherein said dielectric layer extends into said trenches and voids are formed within said dielectric layer at least partially within said trenches to reduce system stress and lower parasitic capacitance between said conducting lines.

6. The method of claim 1 comprising the additional steps of:

forming contact openings through said dielectric layer to said underlying conducting lines;

depositing an additional conducting layer over said dielectric layer and within said contact openings;

forming additional conducting lines and additional dummy conducting areas in said additional conducting layer only by etching additional trenches surrounding said additional conducting lines, said additional trenches being formed to have a width approximately equal to a lithography resolution limit; and depositing a passivation layer overlying said additional conducting lines and additional dummy conducting areas.

7. The method of claim 6 wherein said conducting lines are electrically connected to said underlying semiconductor device structures and wherein said dummy conducting areas have no electrical contacts.

8. The method of claim 6 wherein said additional conducting lines electrically connect to said underlying conducting lines through said contact openings and wherein said additional dummy conducting areas have no electrical contacts.

9. The method of claim 6 wherein voids are formed within said trenches surrounding said conducting lines and areas and wherein the top surface of said dielectric area is planarized.

10. The method of claim 6 wherein voids are formed within said additional trenches surrounding said additional conducting lines and areas and wherein the top surface of said passivation layer is planarized.

11. A method for planarizing an integrated circuit device comprising:

forming semiconductor device structures in a semiconductor substrate;

forming a first conducting layer over said structures;

forming a plurality of wiring lines by etching trenches surrounding the wiring lines;

wherein a first wiring line is formed having a first portion having a first width approximately equal to a lithography resolution limit and a second portion having a second width greater than the first width;

wherein a second wiring line is formed and at least part of the second portion of the first wiring line is adjacent to the second wiring line and separated from the second wiring line by the trench, the trench having a width that is approximately equal to the lithography resolution limit;

wherein at least part of the first portion of the first wiring line is separated from an adjacent conducting structure other than the second wiring line by the trench having a width approximately equal to the lithography resolution limit; and forming a dielectric layer overlying the first wiring line and first conducting structure.

12. A method as in claim 11, wherein the first wiring line has a bend and the first portion and second portion are on opposite sides of the bend.

13. A method as in claim 12, wherein the second portion has the second width from the bend to a position adjacent to the second wiring line.

14. A method as in claim 11, wherein the adjacent conducting structure is a dummy conducting area.

15. A method as in claim 11, further comprising:

the formation of a contact opening through the dielectric layer to the first conducting line;

forming a second conducting layer over the dielectric layer and within the contact opening;

forming a third conducting line in the second conducting layer; and forming a second dielectric layer overlying said third conducting line.

16. A method as in claim 11, wherein all trenches formed in the first conducting layer have a width approximately equal to the lithography resolution limit.

17. A method for planarizing an integrated circuit device comprising:

forming semiconductor device structures in a semiconductor substrate;

forming a conducting layer over said structures;

forming trenches in said conducting layer to define all conducting lines in said conducting layer and all dummy conducting areas in said conducting layer, said trenches formed by etching away conducting material from said conducting layer, wherein all trenches formed in the conducting layer have a width approximately equal to a lithography resolution limit;

wherein two adjacent conducting lines that are separated by at least three times the lithography resolution limit from one another have at least one dummy conducting area formed between said two adjacent conducting lines that is separated from each of the adjacent conducting lines by a trench having a width approximately equal to the lithography resolution limit; and forming a substantially planar dielectric layer overlying the conducting lines and said dummy conducting areas.

18. A method as in claim 17, wherein the width of the trenches is less than twice the thickness of the subsequently deposited dielectric layer.

19. A method as in claim 17, wherein at least one conducting line has a first portion having a first width approximately equal to the lithography resolution limit and a second portion having a second width greater than the first width.

20. A method as in claim 17, wherein a plurality of dummy lines are disposed between two adjacent conducting lines, said adjacent conducting lines separated from one another by a width of at least five times the lithography resolution limit.

21. A method of planarizing an integrated circuit comprising:

forming semiconductor device structures in a semiconductor substrate;

forming a conducting layer over said semiconductor device structures;

forming conducting lines and a dummy conducting region in said conducting layer by etching trenches of the same width surrounding said conducting lines, at least one of said conducting lines completely surrounded by said dummy conducting region;

depositing a dielectric layer overlying said conducting lines and said dummy conducting region.

22. The method of claim 21, wherein said trenches all have a width approximately equal to a lithography resolution limit.

* * * * *